United States Patent [19]
Labunov et al.

[11] Patent Number: 5,880,021
[45] Date of Patent: Mar. 9, 1999

[54] METHOD OF MAKING MULTILEVEL INTERCONNECTIONS OF ELECTRONIC PARTS

[75] Inventors: Vladimir A. Labunov; Vitaly A. Sokol; Vladimir M. Parkun; Alla I. Vorob'yova, all of Minisk, Belarus

[73] Assignee: East/West Technology Partners, Ltd.

[21] Appl. No.: 719,490

[22] Filed: Sep. 25, 1996

Related U.S. Application Data

[62] Division of Ser. No. 124,282, Sep. 20, 1993, Pat. No. 5,580,825.

[51] Int. Cl.$^6$ ............................................. H01L 21/4763
[52] U.S. Cl. ........................ 438/635; 438/618; 438/622; 438/627; 438/688
[58] Field of Search ................................. 438/618, 622, 438/627, 635, 688

[56] References Cited

U.S. PATENT DOCUMENTS

| | | | |
|---|---|---|---|
| 3,862,017 | 1/1975 | Tsunemitsu et al. | 205/124 |
| 3,988,214 | 10/1976 | Tsunemitsu | 204/15 |
| 4,001,871 | 1/1977 | Tsunemitsu | 357/54 |
| 4,158,613 | 6/1979 | Sogo | 204/15 |
| 4,192,729 | 3/1980 | Cancelleri et al. | 204/272 |
| 4,456,506 | 6/1984 | Stein et al. | 205/125 |
| 4,461,924 | 7/1984 | Butt | 174/52 |
| 4,531,144 | 7/1985 | Holmberg | 257/767 |
| 4,784,974 | 11/1988 | Butt | 437/221 |
| 4,888,449 | 12/1989 | Crane et al. | 174/52.4 |

FOREIGN PATENT DOCUMENTS

| | | |
|---|---|---|
| 0234727 | 9/1987 | European Pat. Off. |
| 272755 | 10/1989 | Germany |

*Primary Examiner*—John F. Niebling
*Assistant Examiner*—David A. Zarneke
*Attorney, Agent, or Firm*—Stein, Schifino & Van Der Wall

[57] ABSTRACT

A process for forming a multilevel electronic interconnect structure, the electronic interconnect structure having level conductive paths parallel to a substrate and interlevel electrical interconnections perpendicular to the substrate, the process comprising providing a main aluminum layer over the substrate surface, defining level conductive paths by forming a blocking mask on the main aluminum layer, the blocking mask leaving exposed areas corresponding to the level conductive paths, carrying out a barrier anodization process on the main aluminum layer to form a surface barrier oxide over the level conductive paths, removing the blocking mask, providing an upper aluminum layer over the main aluminum layer, defining interlevel interconnections by forming a blocking mask on the upper aluminum layer, the blocking mask covering areas corresponding to the interlevel interconnections, and subjecting the main and upper aluminum layers to porous anodization. The barrier oxide defining the level conductive paths provides reliable masking of the level conductive paths during porous anodization. The porous aluminum oxide provides intralevel insulation between level conductive paths, and the combination of the barrier oxide and porous oxide provide reliable interlevel insulation between level conductive paths.

20 Claims, 6 Drawing Sheets

METHOD OF MAKING MULTILEVEL INTERCONNECTIONS OF ELECTRONIC PARTS

This is a divisional of application Ser. No. 08/124,282 filed on Sep. 20, 1993, now U.S. Pat. No. 5,580,825.

BACKGROUND OF THE INVENTION

1. Field of the Invention

The present invention is in the field of electronic technology and, in particular, relates to a process for making multilevel interconnections of electronic components.

2. Description of the Background Art

Methods of making multilevel interconnections of electronic elements, and particularly, methods of forming an aluminum interconnect structure on an integrated circuit chip, are known. For example, U.S. Pat. No. 4,158,613, beginning at col. 3, line 50, discloses the formation of each level of a multilevel interconnect structure by way of deposition of an aluminum layer onto a substrate, forming a refractory metal layer over the aluminum along the lines where an interconnect is to be formed, anodizing both the exposed aluminum and the surface of the refractory metal layer so as to form the interconnect structure under the refractory metal layer, and removing the thin layer of the anodized refractory metal.

More specifically, as disclosed in U.S. Pat. No. 4,158,613, an aluminum interconnect layer is deposited on a dielectric layer, a thin layer of tantalum or other refractive metal is deposited over the aluminum in those areas where the interconnects are to be formed, the tantalum layer is patterned with a negative photoresist which forms a blocking mask over the tantalum in a pattern of the interconnect structure to be formed, and the exposed tantalum is etched in a carbon tetrafluoride plasma to form a structure where the remaining portions of tantalum define the aluminum interconnect structure to be finally achieved. The photoresist is removed, the bare tantalum and aluminum layers are anodized simultaneously in a phosphoric or oxalic electrolyte under conditions such that the tantalum will only form a barrier type anodic film while the exposed aluminum layer is completely anodized to form a dielectric porous anodic material down to the dielectric layer thereby defining the aluminum interconnect structure. The tantalum oxide barrier anodic film is then etched away by carbon tetrafluoride plasma leaving behind the unanodized tantalum layer. Other less preferred refractory metals which may be used include niobium and hafnium.

The above procedure provides a method by which it becomes possible to obtain an interconnected multilevel system of electronic elements on semiconductor substrates.

However, in the case of anodizing a metal formed over an insulative substrate, there arises the problem of supplying voltage to the metal regions to be oxidized. In the porous anodization of aluminum down to the insulative substrate surface, the thinning of the aluminum layer through which the voltage is supplied leads to an increase in the voltage drop on the thinning aluminum layer and to a decrease in the anodization voltage. Therefore, the through-oxidation rate will be higher in those regions of the aluminum layer which are nearer to the region of the anodization voltage supply. This phenomenon will lead to a voltage cutoff in the farther regions of the aluminum layer and to the formation of non-oxidized regions of the aluminum layer between the interconnect lines of the level. As a result, shorts may appear between the lines, and the parameters of the intercomponent insulation and their reproducibility may deteriorate.

Moreover, in the deposition of the refractory-metal layer onto the aluminum layer and in the subsequent processing steps, the aluminum and the refractory-metal layers interact to form unanodizable intermetallic compounds in non-pattern areas which degrades the insulating parameters of the intercomponent and interlevel insulation, and lowers the temperature-effect resistance and the reliability of the multilevel system.

As disclosed in DD-A 272755, another method of making a multilevel system of electronic parts is known which involves the formation of each level of an interconnect system by depositing an aluminum layer onto a previously prepared substrate surface, forming a blocking mask in a pattern of the level interconnect lines upon the above-mentioned aluminum layer, carrying out porous anodizing of the exposed aluminum, removing the blocking mask, depositing the next aluminum layer, forming a blocking mask in a pattern of the contact vias to the next level, and carrying out porous anodization.

More specifically, the method disclosed in DD-A 272755 may be realized in the following way. An adhesive nichrome sublayer and an aluminum layer are deposited onto an insulative substrate surface. A porous oxide is formed over the entire aluminum surface which is subsequently boiled in water. An aluminum layer is deposited onto the thus prepared substrate, and a blocking photoresist mask is formed in a pattern of the level interconnect lines on the above-mentioned aluminum layer. The unprotected areas of the aluminum layer are subjected to porous full-depth anodization. Then, the photoresist mask is removed, and the porous aluminum oxide is sealed in boiling water. A further aluminum layer is deposited, and a photoresist mask is formed in a pattern of the contact vias to the next layer is formed upon it. Porous anodization of this aluminum layer is carried out followed by the removal of the photoresist mask and the seal treatment in boiling water. The subsequent levels of the interconnections are formed in the same way.

The method of DD-A 272755 has a number of disadvantages. Firstly, the sealing of the porous oxide in boiling water results in deterioration of the insulating properties of the aluminum oxide and in the reduction of its resistance to mechanical and temperature effects due to its hydration.

Secondly, the use of the aluminum single-layer oxide as interlevel insulation causes reduced reliability of the interconnect system of the electronic parts due to the existence of the hydrated porous aluminum oxide in the positions of the crossovers of different-level interconnect lines. The hydrated porous aluminum oxide has a low breakdown voltage, as well as insufficient time and thermal stability characteristics.

Thirdly, in forming contact vias to the next level by the process of depositing an additional aluminum layer and porous anodization thereof, there is the risk of oxidation of the previously formed interconnect lines due to the absence of a protective layer on their surfaces, the effect being compounded by the differences in the rates of the porous anodization over the substrate area and due to the thickness non-uniformity of the aluminum layers being deposited. These factors may cause breaks in the lines, decrease of the cross-sections of the lines, and, hence, decrease of the electrical conductivity and intensity of electromigration. All this reduces the reliability of the interconnect system, the reproducibility of its parameters and the accuracy of the geometric sizes and, also, complicates the control and monitoring processes.

Moreover, during the porous anodization process when forming contact vias to the next level, the photoresist mask edges are undermined because of the bulk growth of the porous oxide. Further, electrolyte leaks may occur under the photoresist mask to cause the total stripping of the mask. The result is a decrease in the contact via areas due to the oxidation of some part of their surfaces, and hence an increase in the resistance of the contact vias, or even a break in contact.

As disclosed in JP-B 56-43637, a further method of making a multilevel interconnected system of electronic parts is known, which involves the formation of each level of the system by way of depositing an aluminum layer on a substrate surface, forming a blocking mask leaving exposed the intended pattern of the level lines upon the above mentioned layer, carrying out barrier anodization, removing the blocking mask, and carrying out porous anodization.

More specifically, the method of JP-B 56-43637 is realized in the following way. An aluminum layer is deposited on a previously cleaned surface, and a blocking mask leaving exposed the pattern of the level lines is formed upon the above-mentioned layer. Then, a barrier aluminum oxide is formed in a solution of ammonium pentaborate in ethylene glycol, at voltages ranging from several tens to several hundred volts. The barrier aluminum oxide is formed at the interconnect lines and at those areas of the aluminum layer which are at the anodizing electrolyte interface. After the blocking mask has been removed, the process of porous anodization is carried out in an aqueous solution of sulfuric acid at a voltage of not more than the half value of the voltage applied in the formation of the barrier aluminum oxide. A photoresist mask is formed and the barrier aluminum oxide is selectively etched to remove the oxide and expose the aluminum surface to make contact vias to the next level. The subsequent levels of the interconnect system of electronic parts are formed in the same way.

The method of JP-B 56-43637 allows the making of a multilevel interconnected system of electronic parts both on a semiconductor and on an insulative substrate. However, the method has the following disadvantages.

First, the interlevel isolation consists of only a thin, barrier aluminum oxide which cannot be obtained thicker than 0.2–0.25 $\mu$m. Such a thin barrier aluminum oxide layer has low breakdown voltages, small mechanical strength and a large probability of pinholes resulting in reduced thermal and mechanical stability and reliability of this interconnect system of electronic parts.

Second, in the regions of the interconnect line crossovers, large stray capacitances appear, as the permittivity of the barrier aluminum oxide is in the range of about 8–9, thereby degrading the frequency characteristics and functional usefulness of the system.

Further, the method does not produce a reliable electrical insulation between the lines of the same level, since in the process of porous anodization of the aluminum layer, a redistribution and cutoff of the anodizing voltage occurs in the regions farthest from the contact area, and it leads to the appearance of non-oxidized portions. This deteriorates the intercomponent insulation, particularly on substrates with rough surfaces and with thickness non-uniformity of the aluminum layer over the substrate area.

Besides, in the process of porous anodization, the rate of the aluminum oxide growth deep into the metal decreases with a decrease in spacing between the lines in the level. This results in non-oxidized portions between the interconnect lines with the smaller spacing deteriorating the insulating properties of the intercomponent insulation.

Further yet, the use of the chemical etch step leads to additional contamination of the layers by the etch process products, and it degrades the insulating properties of the intercomponent and interlevel insulation, complicates the technological process and causes ecological problems.

In the formation of a blocking photoresist mask upon the surface of a porous aluminum oxide, the photoresist penetrates into the bulk of the porous insulator and is not totally removed, even by plasma chemical stripping of the photoresist. The organic substance residues inside the porous oxide degrades the adhesion of the aluminum layers in the subsequent deposition of them and deteriorate the reproducibility and reliability parameters of the multilevel interconnection system.

A further disadvantage of the method of JP-B 56-43637 lies in the non-planarity of the surface of each level due to the bulk growth of the porous oxide, this non-planarity being especially obvious when thick aluminum layers are used. The non-planarity of the level surface can lead to the thinning and breaking of the next-level interconnect lines where the lines bend at the pattern steps, significantly reducing the reliability of the multilevel interconnected system.

U.S. Pat. No. 3,988,214 (Tsunemitsu '214) and divisional U.S. Pat. No. 4,001,871 (Tsunemitsu '871) teach an integrated circuit device wherein multi-level interconnections of the wiring structure are formed by selective anodization of aluminum into insulating structures, leaving conductive non-anodized channels. As can be seen in FIG. 4 of these patents, an aluminum film is deposited on a substrate. The aluminum surface is covered with a photoresist, leaving exposed the areas in which the wiring layer is to be formed, and anodic oxidation is carried out using constant voltage with ammonium borate saturated ethylene-glycol, so that the exposed surface of the aluminum film is selectively covered by a non-porous alumina (FIG. 4(C)). The photo-resist is removed (FIG. 4(D)). The non-porous alumina layer serves as a mask against further anodization when the unmasked aluminum 404 is changed to porous alumina 404 (FIG. 4(E') using 2–5% acid applied to the aluminum at a constant 20 volts. FIGS. 5(A)–(E') show the formation of porous alumina (FIG. 5(C), depositing a resist over the exposed metal where it is desired to have an interconnect (FIG. 5(D'), and hard anodizing the exposed aluminum to form a hard anodized interlevel insulator layer and exposed interconnects ("electrode lead-out portion on the surface of the aluminum film" col. 6, lines 22–23).

The semiconductors formed in accordance with these patents suffer the same disadvantages as associated with JB-B 56-43637 discussed above. First, the interlevel isolation consists of only a thin, hard aluminum oxide, which has low breakdown voltages, small mechanical strength and a large probability of pinholes resulting in reduced thermal and mechanical stability and reliability of this interconnect system of electronic parts. Second, in the regions of the interconnect line crossovers, large stray capacitances appear, as the permittivity of the hard aluminum oxide is 9–11, thereby degrading the frequency characteristics and functional usefulness of the system.

Further, the method does not produce a reliable electrical insulation between the lines of the same level, since in the process of porous anodization of the aluminum layer, a redistribution and cutoff of the anodizing voltage occurs in the regions farthest from the contact area, and it leads to the appearance of non-oxidized portions. This deteriorates the intercomponent insulation, particularly on substrates with rough surfaces and with thickness non-uniformity of the aluminum layer over the substrate area. Besides, in the process of porous anodization, the rate of the aluminum oxide growth deep into the metal decreases with a decrease in spacing between the lines in the level. This results in non-oxidized portions between the interconnect lines with the smaller spacing deteriorating the insulating properties of the intercomponent insulation.

Therefore, it is an object of this invention to provide an improvement which overcomes the aforementioned inadequacies of the prior art devices and provides an improvement which is a significant contribution to the advancement of the process for making multilevel interconnections of electronic components art.

Another object of this invention is to provide a process by which it becomes possible to reliably obtain a planar multilevel system of electronic-element interconnections with high insulating properties of the intercomponent and interlevel insulation, a planarity of each level surface, high reliability and reproducibility of electrophysical parameters, and accurate geometrical sizes of the interconnect elements.

Another object of this invention is to provide a process for producing interconnections which does not require chemical etching and which is relatively ecologically safe.

Another object of this invention is to provide a novel process for the production of interconnections such that a greater breadth of useful geometric designs can be achieved, the incorporation of passive resistive and capacitive elements into any level of the interconnect system may be accomplished without concern for compatibility with metal wiring boards, and which increases the quality, reliability and packing density of microelectronic devices and ensures their high resistance to mechanical, temperature and electromagnetic effects.

Another object of this invention is to provide a multilevel system of interconnections comprising of only metallic aluminum, barrier aluminum oxide and porous aluminum oxide layers, that is, a system in which aluminum oxides are used to insulate metallic aluminum interconnects.

Another object of this invention is to provide a process which can ensure the planarity of each level of the multilevel system and which thus enhances the insulating properties of the interlevel and intercomponent insulator, the reproducibility of the electrical parameters and the reliability of the interconnections of the electronic parts.

Another object of this invention is to provide a process for the fabrication of a multilevel interconnected system which can be easily automated and achieves high reproducibility of the device parameters, yet does not require large floor-spaces, special equipment or scarce materials. The process should utilize minimal quantities of materials and inexpensive metallization materials, such as aluminum, valve metals and their anodic oxides, and should employ standard vacuum and photolithography equipment as found in present day electronic enterprises.

The foregoing has outlined some of the pertinent objects of the invention. These objects should be construed to merely illustrative of some of the more prominent features and applications of the intended invention. Many other beneficial results can be attained by applying the disclosed invention in a different manner or modifying the invention within the scope of the disclosure. Accordingly, other objects and a fuller understanding of the invention can be seen by reference to the following detailed description of the preferred embodiment in addition to the scope of the invention defined by the claims taken in conjunction with the accompanying drawings.

SUMMARY OF THE INVENTION

The present invention concerns a process for forming a multilevel electronic interconnect structure, said electronic interconnect structure having level conductive paths parallel to said substrate and interlevel electrical interconnections perpendicular to said substrate, said process comprising the steps of:

providing a main aluminum layer over a substrate surface;

defining conductive paths by forming a blocking mask on said main aluminum layer, said blocking mask leaving exposed areas corresponding to said level conductive paths, carrying out a barrier anodization process on said main aluminum layer to form a surface barrier oxide over said level conductive paths, removing the blocking mask, providing an upper aluminum layer over the main aluminum layer, defining interlevel interconnections by forming a blocking mask on said upper aluminum layer, said blocking mask covering areas corresponding to said interlevel interconnections, and subjecting said main and upper aluminum layers to porous anodization.

The multilevel structure preferably comprises a level nearest the substrate and one or more levels over the level nearest the surface. Preferably, two or more levels of the multilevel interconnect electronic component are formed in accordance with the above described process. Most preferably, all levels of the electronic component are formed in accordance with the above process.

The barrier oxide on the surface of the interconnect lines provides reliable masking of the interlevel connection lines during porous anodization.

In one of the preferred embodiments, before the formation of the photoresist mask on the upper aluminum layer, a barrier oxide is formed on the upper aluminum layer in a pattern of the contact pads and vias to the next level. The barrier oxide forms an additional mask and, since it forms a tighter bond with the aluminum surface and is less susceptible to pealing, leaking, and undercutting, it is preferred that the geometrical size of this underlying barrier oxide exceeds that of the photoresist mask and thereby prevents undermining of the photoresist mask edges.

Most preferably, the photoresist mask should be smaller than the barrier oxide by a value exceeding twice the photolithographic error. The photolighographic error represents the combination of factors such as human error, focus, misalignment of contact plates, etc. and is thus based not only on equipment but also on the experience of the operator. This optional barrier anodization of the upper aluminum layer is exemplified in Example 4. After the process of porous anodization, the photoresist mask and the barrier oxide are removed for the formation of the contact vias between the levels.

In a preferred embodiment the first photoresist mask is formed in a pattern leaving exposed the first level interconnect lines and the frames around the contact pads and contact vias. The surface of the exposed regions is barrier anodized to form a barrier oxide over the level interconnect lines and frames. Then the first photoresist mask is removed and an upper aluminum layer is deposited. An additional photoresist mask leaving exposed a pattern of the frames around the contact pads and contact vias is formed and barrier anodization is carried out to form a barrier oxide on the surface of the upper aluminum layer in a pattern of the frames around the contact pads and contact vias to the next level. The additional photoresist mask is removed and a second photoresist mask in a pattern of the contact pads and contact vias is formed. Next, the process of through porous anodization of the main and upper aluminum layers is carried out. The edges of the photoresist mask are designed to be in the middle of the corresponding frames around the contact pads and contact vias barrier oxide. The geometrical sizes of the barrier oxide over the frames around the contact pad and contact via are equal to a value exceeding the doubled photolithographic error.

The invention is particularly useful in making multilevel interconnected systems for large scale integrated circuit (LSI), very large scale integrated circuit (VLSI), and large scale hybrid integrated circuit (LSHI) wiring boards and microcircuit assemblies used in production of high-scale integrated microelectronics with improved mass and size characteristics, and in making functionally completed assemblies and blocks.

This process may be advantageously employed in the computer art when fabricating computers and microcalculators, high-powered programmable computers and data processing systems.

The process of the present invention can be used in fabrication of consumer electronics such as audio- and video-electronics, electronic games, consumer equipment automation and control barrierware.

The foregoing has outlined rather broadly the more pertinent and important features of the present invention in order that the detailed description of the invention that follows may be better understood so that the present contribution to the art can be more fully appreciated. Additional features of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a fuller understanding of the nature and objects of the invention, reference should be had to the following detailed description taken in connection with the accompanying drawings in which:

FIGS. 3–30—illustrate the process sequence of the two-level system, according to the invention, in which:

FIG. 3 shows the main aluminum layer 7 upon the substrate surface 1,

FIG. 4 shows the main aluminum layer 7 of thickness which uniformly increases from the edges to the opposite edge, FIG. 5 shows the valve-metal layer 8 (e.g., tantalum) on the substrate which lies under the main aluminum layer, FIG. 6 shows the first photoresist mask 9 formed in a pattern leaving exposed the desired first-level lines, FIG. 7 shows a top view of the first photoresist mask formed in a pattern leaving exposed the level lines, FIG. 8 shows the barrier aluminum oxide 11 on the surface of the first-level lines in the pattern of the desired first-level lines, FIG. 9 shows the upper aluminum layer 12, FIG. 10 shows the second photoresist mask 13 formed in a pattern of the contact pads and contact vias to the second level, FIG. 11 shows a top view of the second photoresist mask 3, 5 and 6, FIG. 12 shows a top view of the second photoresist mask with the fringe 14 over the substrate perimeter, the region of the voltage supply 10 excluded, FIG. 13 shows the porous aluminum oxide 15 between the first level interconnect lines 2, and between the contact vias 5 and contact pads, FIG. 14 shows the additional photoresist mask 16 formed in a pattern leaving exposed the contact vias 17 and contact pads 18 prior to barrier anodization, FIG. 15 shows a top view of the additional photoresist mask leaving exposed the contact vias 17 and contact pads 18 prior to barrier anodization, FIG. 16 shows the barrier aluminum oxide 19 above the contact pads and contact vias, FIG. 17 shows the blocking mask 20 made of the second photoresist mask 13 and of the barrier aluminum layer 19 above the contact pads and contact vias, FIG. 18 shows the porous aluminum oxide 15 between the first-level lines, contact vias and pads, FIG. 19 shows the planar surface of the first-level after the surface was polished, FIG. 20 shows the barrier valve-metal oxide 21 formed from a part of the valve-metal layer, FIG. 21 shows the barrier valve-metal oxide 21 formed from the valve metal layer, FIG. 22 shows the first photoresist mask 22 formed in a pattern exposed the first-level lines and a frames around the contact pads and contact vias, FIG. 23 shows a top of the first photoresist mask leaving exposed the first-level lines 23 with the windows to the future contact pads and contact vias and the frames 24 around the contact pads, FIG. 24 shows the barrier aluminum oxide 11 above the first-level lines, and the barrier aluminum oxide 25 above the frames around the contact pads and contact vias in each level, FIG. 25 shows the upper aluminum layer 12 in case to form the frames around contact pads and contact vias in each level, FIG. 26 shows the additional photoresist mask 26 formed in a pattern of the frames around the contact pads and contact vias, FIG. 27 shows a top view of the additional photoresist mask 26 with the frames around the contact pads 24 and contact vias 27, FIG. 28 shows the barrier aluminum oxide 28 on the upper aluminum layer in a pattern leaving exposed the frames around the contact pads and contact vias, FIG. 29 shows the second photoresist mask 13 in case to form the frames around contact pads and contact vias in each level, FIG. 30 shows a top view of the second photoresist mask 13 in case to form the frames around contact pads and contact vias in each level.

Similar reference characters refer to similar parts throughout the several views of the drawings. The following reference characters are used in the drawings:

Figure 1:
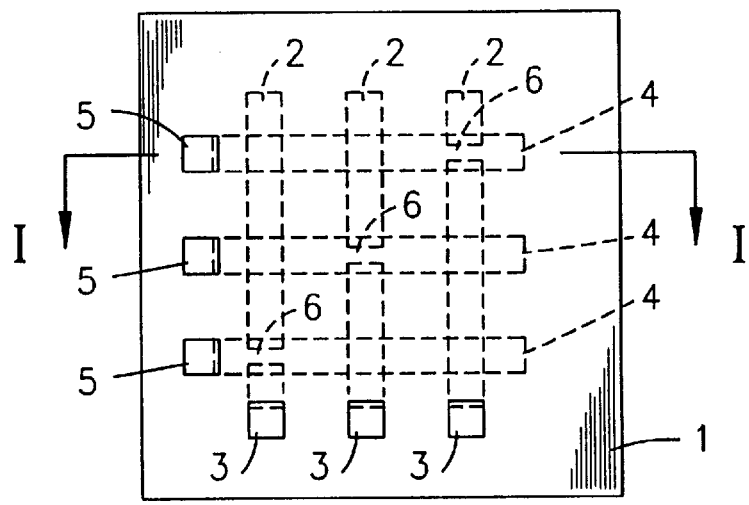
FIG. 1 represents a plan view of a portion of a two-level system of electronic parts interconnections, according to the invention.
Figure 2:
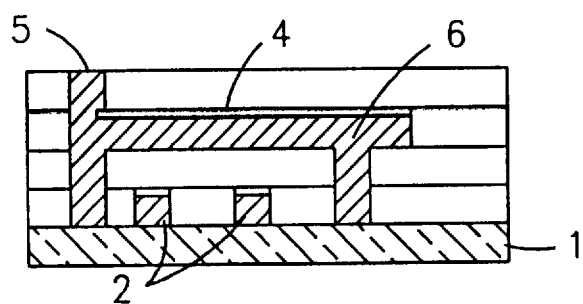
FIG. 2 shows a cross section of the two-level system, according to the invention, sectioned over the line I—I of FIG. 1.

1—substrate;
2—first-level interconnect lines;
3—first-level contact pads;
4—second-level lines;
5—second-level contact pads;
6—contact vias to the second level;
7—main aluminum layer of the first level;
8—valve-metal layer;
9—first photoresist mask formed in pattern of the first-level lines;
10—voltage-supply area;
11—barrier aluminum oxide above the first level-lines;
12—upper aluminum layer of the first level;
13—second photoresist mask formed in a pattern of the contact pads and vias;
14—photoresist mask over the substrate perimeter;
15—porous aluminum oxide above the first-level lines and between the contact pads and contact vias;
16—additional photoresist mask formed in a pattern of the contact pads and contact vias;
17—contact vias on the additional photoresist mask;
18—contact pads on the additional photoresist mask;
19—barrier aluminum oxide above the contact pads and contact vias;
20—blocking mask made of the barrier oxide 19 and of the second photoresist mask 13;
21—barrier valve-metal oxide;
22—first photoresist mask formed in pattern of the first level lines with the frames around the contact pads and contact vias;
23—first-level interconnect lines with the windows for future contact pads and contact vias;
24—frames around the contact pads;
25—barrier aluminum oxide above the frames around contact pads and contact vias on the first aluminum layer;
26—additional photoresist mask formed in a pattern of the frames around the contact pads and contact vias;
27—frames around the contact vias;
28—barrier aluminum oxide above the frames around the contact pads and contact vias on the second aluminum layer;
29—main aluminum layer of the second level;
30—third photoresist mask formed in a pattern of the second-level lines;
31—barrier aluminum oxide above the second-level lines;
32—upper aluminum layer of the second level;
33—fourth photoresist mask formed in a pattern of the contact pads; and
34—porous aluminum oxide over the second-level and between the contact pads.

DETAILED DESCRIPTION OF THE PREFERRED EMBODIMENT

The aluminum substrate used in accordance with the present invention may be of any dielectric material conventionally employed, such as glassceramic, but is preferably an aluminum or aluminum alloy which has been anodized on both sides to render the surfaces dielectric.

In accordance with the present invention, a main aluminum layer 7 is deposited on the surface of substrate 1, and a blocking mask 9 is formed thereon, leaving exposed a pattern 2 of the level interconnect lines on the main layer. Barrier anodization of the main aluminum layer in the areas left exposed by the blocking mask results in the formation of a barrier aluminum oxide pattern 11 above the pattern of the level interconnect lines to be formed. Then, after the first blocking mask has been removed, an upper aluminum layer 12 is deposited, over which is formed the blocking mask 13 in the pattern of the contact pads 3, 5 and contact vias 6. Subsequent porous anodization of the two aluminum layers ensures the formation of the combined interlevel insulator 15 over the interconnect lines of different levels, and the formation of a porous aluminum intercomponent (intralevel) insulator between the level interconnect lines, with unanodized aluminum metal below the contact pads and contact vias.

The interlevel combined insulator thus consists of both the barrier anodized layer 11 over the main aluminum layer and the porous oxide upper aluminum layer 15. This combined insulator improves the insulating properties of the interlevel insulation and increases the reproducibility of the parameters and reliability of the metallization of the multilevel interconnected system, since the barrier aluminum oxide in such a structure ensures high breakdown voltages and low leakage currents of the interlevel insulation, while the porous oxide improves the frequency characteristics of the interlevel insulation and increases its mechanical strength.

That is, the formation of the photoresist mask in a pattern of the contact pads and contact vias to the next level upon the upper aluminum layer followed by porous anodization of the two aluminum layers allows the simultaneous formation of the planar interlevel and intercomponent insulations, as the porous oxide is formed simultaneously (a) over the interconnect level lines, anodizing the upper aluminum layer over the barrier aluminum oxide, and (b) between the lines of the interconnections, since both the main and upper aluminum layers are porous anodized.

Barrier aluminum oxide is produced using a characteristic electrolyte as is well known in the art and discussed below, and results in the oxide having the property of a very dense material. There is no dissolving of the aluminum oxide as occurs in porous oxidation. Because the barrier oxide is very hard, it cannot grow to a thick layer. Mostly, it is a few thousand angstroms.

All those working in this art know the difference between barrier and porous anodization.

Porous anodization involves dissolving of the surface of the aluminum oxide and results in the formation of pores inside of the surface. Thereafter, the bottom of the pores can be anodized. Dissolving and anodization simultaneously. The pores generally proceed perpendicularly with the surface of the substrate and can go very deep into the surface of the aluminum and thereafter, when the surface of material becomes total cover porous, anodization goes on and can go very deep into the material.

In the process of porous anodization of both aluminum layers, the barrier oxide on the surface of the interconnect lines provides reliable masking of the lines, so that breaks of the lines can be avoided, and making it possible to obtain interconnect lines of a uniform thickness over the entire substrate area and to obtain a reliable spacing between them in a level. As a result, shorts and line breaks are avoided, the electromigration stability of the interconnections increase, and a high accuracy of the geometrical sizes of the system elements is achieved.

A further advantage of the present invention is that the process for the formation of the contact vias to the next level makes possible the elimination of the etch operation for exposing contact windows and, hence, to reduce the contamination of the metallization layers, to simplify the process, and to ensure its ecological safety. Also, since the upper aluminum layer is deposited over the unanodized aluminum of the main aluminum layer, contact is improved, and there is no risk of organic mask impurities between the aluminum layers. Also, porous oxidation of both layers simultaneously improves bonding as compared to the process involving depositing aluminum, porous anodizing, depositing an upper aluminum layer and porous anodizing.

In a preferred embodiment of the invention, before the formation of the photoresist mask on the upper aluminum layer, a barrier oxide is formed on its surface in a pattern of the contact pads and vias to the next level. Over the barrier oxide is formed a photoresist mask in the same pattern of the contact pads and vias to the next level, the geometrical sizes in the perimeter of the photoresist mask preferably being chosen such that they are smaller than the barrier oxide sizes by the value of the doubled photolithographic error, and the structure is subjected to porous anodization followed by the removal of the photoresist mask and the barrier oxide.

The creation of the barrier oxide in the pattern of the contact pads and vias to the next level upon the upper aluminum layer prior to the formation of the photoresist mask, with the geometrical sizes of this barrier oxide exceeding those of the photoresist mask, prevents the undermining of the photoresist mask edges (prevents the "edge effect") and, hence, increases the reproducibility of the parameters and the reliability of the interconnect system and ensures the high accuracy of the geometrical sizes of the elements.

The formation of the photoresist mask with the edges lying on the surface of the barrier anodized layer also eliminates electrochemical dissolution of the barrier oxide and, consequently, increases the reliability of the interconnect system.

In this preferred embodiment of the invention the subsequent removal of the photoresist mask and the barrier oxide following the porous anodization is necessary for the formation of the contact vias between the levels.

The geometrical sizes of the photoresist mask should be smaller than the barrier oxide by the value of the doubled photolithographic error. The reduction of the geometrical sizes of the photoresist mask, compared to those of the barrier oxide, by a value smaller than the doubled photolithographic error, can lead to the situation where the photoresist mask edges appear to be outside the barrier oxide, and their undermining is possible. The term "photolithographic error" is used herein to mean the sum total of the variations which occur in a standard process, and depends upon the equipment, skill and experience of the operator. The sum total of the photolithographic error is doubled so that, taking these factors into account, it can be expected that the edge of the resist will not extend over the edge of the barrier anodized area on the upper aluminum layer and onto the surface of the non-anodized aluminum.

The reduction of the geometry of the photoresist mask formed in a pattern of the contact pads and vias to the next level, compared to the barrier oxide sizes, by a value exceeding the doubled photolithographic error leads to a reduction of the contact pad areas and to a decrease of the packing density. Moreover, the contact via resistance increases.

It is preferable that the removal of the photoresist mask (and the barrier oxide in the case of the preferred embodiment) after the porous anodization would be realized by surface polishing. Surface polishing ensures the planarity of the level surface and high reliability of the multilevel interconnected system.

It is advisable to carry out the process of porous anodization by way of immersing the substrate into an electrolyte at the rate of $0.4$–$1.0 \times 10^{-4}$ m/s such that the substrate surface is perpendicular to the electrolyte surface, and keeping the substrate in the electrolyte until the aluminum is totally oxidized.

Such a process of porous anodization results in the formation of a thickness gradient of the porous oxide layer in the direction of the immersion. The thickness of the aluminum layer under the oxide increases uniformly towards the upper substrate edge where the region of current supply is. Thus, a reliable supply of the anodizing voltage to all portions of the aluminum layer is provided in the process of through anodization. This process excludes the appearance of non-oxidized regions between the interconnect lines in the main aluminum level, and improves the insulating properties of the intercomponent insulation, increasing the reproducibility of the parameters and the reliability of the system.

The immersion at the suggested rate ensures a reliable supply of the anodizing voltage in the process of porous anodization and excludes the possibility of the porous oxide layer burn-out (scorching), the heating up of the anodization region on the account of raising the thin layer of the electrolyte above the water line, and lessening the transfer (runaway) of heat into the electrolyte.

The lower limit of the immersion rate is $0.4 \times 10^{-4}$ m/s. Below the lower rate of the substrate immersion into the electrolyte, a heating of the layer being anodized occurs at the layer-electrolyte-air interface. This may lead to an uncontrolled increase of the porous anodization rate at the interface, oxide burn-out in this region and, thus, the deterioration of the insulating properties of the intercomponent insulation and an impediment of the control and monitoring of the porous anodization process. That is, as a result of a major heat up of anodization regions under the thin layer of the electrolyte, metallic inclusions may appear or develop into the volume of the growing oxide, which causes the deterioration of the electro-isolating properties of intercomponent isolation. Besides this, the local heat-up causes uncontrollable change in the speed of anodization, and complicates control of the process.

The upper level of the substrate immersion rate into the electrolyte in the porous anodization process is chosen to be $1.0 \times 10^{-4}$ m/s.

At a higher rate of immersion it may occur that the change in the thickness of the aluminum layer under the porous oxide does not exceed the non-uniformities of the substrate surface and the thickness non-uniformity of the aluminum layers deposited. This can result in the anodizing voltage cutoff in some parts of the aluminum layers being anodized and the appearance of non-oxidized portions (pockets) between the interconnect lines. As a result, the insulating properties of the intercomponent insulation become worsened.

Such process steps ensure a reliable separation of the interconnect lines and reproducibility of the electrophysical parameters of the intercomponent insulation in a level, a high layer adhesion to the substrate and layer-to-layer adhesion in the levels. It ensures a reliable, mechanical and temperature effect resistant interconnect system.

It is desirable that, prior to the deposition of the main aluminum layer onto the substrate surface, a layer of a metal selected from the valve metals group including tantalum, niobium, hafnium, zirconium and titanium would be deposited, which valve metal is subject to a barrier anodization process following the process of porous anodization of the aluminum interlevel insulation, with subsequent thermal treatment at a temperature ranging from 350° to 450° C.

The term "valve metal" has remained from previous research, and on the whole, is unsatisfactory for present day applications. The term emphasizes the property of an electrode made from this metal which is covered with an oxide film (passing in the cathode direction). A more characteristic property of this group of metals is that during anodal polarization, these metals form a defensive film of oxide with a high resistance. Tantalum possesses this property to a higher degree.

The valve metal deposited onto the substrate surface and underlying the main aluminum layer is barrier oxidized not through the whole depth during the porous anodization process, and the thickness of the barrier oxide of the valve metal is a consequence of the forming voltage in the porous anodization process. The non-anodized layer of the valve metal provides a reliable supply of anodizing voltage to all regions of the aluminum layer and thus ensures the aluminum-layer through-oxidation over the entire substrate surface.

During the last stage of anodization of the main level of aluminum in the electrolyte for pore anodization, the oxidation boundary reaches to the surface level of the valve metal and an electro-chemical dissolving of the bottom pore of the porous aluminum oxide takes place. After this, dense anodization begins in the pores of the valve metal regions. For complete oxidation of the valve metal, it is necessary to increase the voltage of the anodization, which is possible due to the electrolytes used for dense anodization. Electrolytes used for barrier/dense anodization can be aqueous solutions of organic and inorganic acids. For example, aqueous solutions of citric acid, sorrel acid, vinegar, and other organic acids; aqueous solutions of ortho-phosphoric, chamois, boric and other inorganic acids; anhydrous solutions in ethylene glycol, glycerine, and alcohol; such as solutions of ammonium pentaborate in ethylene glycol, glycerine and others. The electrolyte type is chosen specifically for each particular valve metal. Tantalum, for example, anodizes in almost all aqueous electrolyte acids, except plavikovoi (phtoristo-hydrogen) acid, which dissolves with the oxide. The voltage of the anodization depends on the type of metal and the electrolyte chosen, and is limited by the breakdown, which occurs when the determined thickness of the oxide is attained. For example, anodization of the tantalum in anhydrous electrolyte based on ammonium pentaborate can be conducted at tension of up to 350 volts.

By carrying out the process of barrier anodization of the valve metal after the porous anodization of the aluminum, the oxidation of the remaining layer of the valve metal is ensured, as the barrier anodization front is planar.

The subsequent heat treatment at a temperature ranging from 350° to 450° C. allows the complete oxidizing of any possible remnants of the valve metal in the positions of such defects as cracks, blisters, scratches and cavities. In addition, as a result of heat treatment the leakage currents of the interlevel and intercomponent insulator decreases, increasing its thermal and long-term stability.

The temperature of the heat treatment is chosen to be within the 350°–450° C. At a temperature lower than 350° C., thermal oxidation of the valve metal does not take place. At a temperature higher than 450° C., the porous aluminum oxide becomes partially crystallized, and its electrophysical properties deteriorate.

During the process of anodization of the valve metals through the porous aluminum oxide, a dielectric layer with high insulating parameters is formed. Moveover, the valve metals are thermally oxidized at a temperature lower than 450° C.

It is desirable to deposit the main aluminum layer with its thickness uniformly increasing from one of the edges to the opposite edge such that the gain in the thickness of the aluminum layer being deposited measured in mu per unit substrate length in mm would be within the range of 1.5–2.0, and to supply the voltage during the porous anodization process from the substrate side having larger thickness of the deposited aluminum layer.

This way of controlling the porous anodization front is an alternative to the way of accomplishing the same effect as in the embodiment where the uniform substrate is immersed into an electrolyte at the rate of $0.4-1.0 \times 10^{-4}$ m/s which results in the formation of a thickness gradient of the porous oxide layer in the direction of the immersion, and therefore an increase in the thickness of the aluminum layer in the direction of the anodization voltage supply (i.e., the differences are illustrated in Examples 3 and 4). Thus, it is not necessary to control the rate at which the substrate with non-uniform thickness film is immersed in the bath. These are two variations.

In this case, the front of the porous anodization of the main aluminum layer will shift uniformly from the edge with the smaller thickness to the opposite edge providing the supply of the anodic voltage to all regions of aluminum layer. It ensures a reliable separation of the interconnect lines and a high resistance value of the intercomponent insulation.

If the thickness gain of the main aluminum layer measured in nm per unit substrate length in mm is smaller than 1.5, the distribution of the aluminum layer thickness may not exceed the non-uniformities of the substrate surface. It can cause the anodizing voltage cutoff in some regions (pockets) of the aluminum layer being anodized and the appearance of non-oxidized portions between the interconnect lines. As a result, the insulating properties of the intercomponent insulation deteriorate.

If the thickness gain of the main aluminum layer is larger than 2.0, the interconnect lines are formed with large thickness gain (gradient) on the substrate square which can cause the interconnect system failure in the sites of the lines of smaller cross-sections. Moreover, in this case, the process of porous anodization becomes non-uniform, the rate of the anodization front movement from one edge of the substrate to another reduces, and the already formed porous oxide is electrochemically etched, which deteriorates its insulating properties.

It is advisable to form the photoresist mask over the substrate perimeter simultaneously with the process of the photoresist-mask formation in a pattern of the contact pads and vias to the next level, the region of the voltage supply excluded, and to enlarge the photoresist mask over the substrate perimeter by the value of the doubled photolithographic error in the process of the formation of each subsequent level.

When the photoresist masks are formed in such a way, during subsequent porous anodization, the photoresist-protected aluminum region over the substrate perimeter remains non-oxidized, providing a reliable voltage supply to every part of the aluminum layer. It insures against the non-oxidation of the parts between the interconnect lines, thus improving the intercomponent-insulation insulating parameters and their reproducibility.

The enlargement of the photoresist mask over the substrate perimeter in the formation of each subsequent level leads to the aluminum layer of each next level lying upon the porous oxide of the previous level. Since in the final step of multi-level structure production the porous anodization rate of the aluminum layer lying upon the porous oxide of the previous level is lower than the anodization rate of the aluminum lying upon the aluminum layer, the mask over the substrate perimeter made according to the above-mentioned way will insure against a voltage cutoff. It increases the reliability of the interconnect system.

The value of the enlargement of the mask over the substrate perimeter is chosen to amount to the doubled photolithographic error.

If this enlargement is smaller than the photolithographic error, some regions of the aluminum layer of the next level are formed lying upon the aluminum of the previous level, due to misalignment in the photolithography step. Since in these regions the rate of the porous anodization in the final step is higher than the anodization rate of the next-level aluminum lying upon the previous-level porous oxide, the process of through oxidation will occur in these regions, and, consequently, the voltage will be cut off. As a result, the process of porous anodization will be stopped.

If this enlargement exceeds the doubled photolithographic error, the substrate useful area for the formation of the interconnections between the electronic parts will decrease.

The multilevel system of electronic parts interconnections which are made according to the present invention can have the following basic specifications.

| | |
|---|---|
| Minimum width of conductors and spaces between them, $\mu m$ | 10–30 |
| Surface resistivity of conductors, ohm/square | 0.01–0.04 |
| Technological accuracy of topology geometrical sizes, $\mu m$ | ±0.5 |
| Resistance of interlevel contact vias (via area = $10^{-4}$ cm$^2$), ohm | 0.02–0.05 |
| Dielectric strength of interlevel insulation, V/cm | $8.10^5$–$2.5.10^6$ |
| Capacitive parasitics interlevel insulation (crossover area = $10^{-4}$ cm$^2$) | 0.3–0.5 |

The implementation of the invention in industry does not require large floor-spaces, special equipment or scarce materials. Minimal quantities of inexpensive metallization materials, such as aluminum, valve metals and their anodic oxides, are used. Standard vacuum and photolithography equipment can be used to implement the process, i.e., the fabrication process can be organized at the level of the electronic enterprises.

Due to the simplicity of monitoring and control of the process, the fabrication process of the multilevel system can be easily automated, and high reproducibility of the device parameters can be achieved.

The fabrication process of the multilevel metallization includes only three basic steps—vacuum deposition, photolithography and electrochemical anodization.

Besides, the fabrication of the devices with the multilevel interconnect system in accordance with the present invention is ecologically safe compared to the fabrication process of printed circuit boards, due to the elimination of chemical etch steps using aggressive enchants and due to the simplicity of utilizing production wastes. The technology of production waste utilization is not the subject of this application and therefore no description thereof need be provided in the text. It is obvious that the solutions used for barrier/dense and porous anodization, such as dilute aqueous solutions of citric, sorrel and ortho-phosphoric acids are used, in contrast to concentrated poisons of complex compounds which contain aggressive acids, such as HF, which are used in known technologies.

The most effective is to use the present process at electronic enterprises for fabricating HIC's and printed circuit boards of the increased scale of integration and packing density which have high resistance to mechanical, temperature and electromagnetic effects.

The invention will now be described by means of illustrative examples, with reference to the figures. The following examples are not intended to be limiting in any way. Further variations and embodiments of invention will become apparent from the following.

EXAMPLE 1

Figure 3:
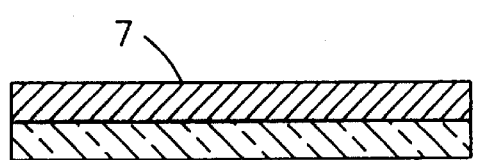

An aluminum layer 7 is deposited onto a glassceramic substrate 1 preheated to a temperature of 150° C. at a residual pressure $1.33 \times 10^{-3}$ Pa by the electron-beam evaporation method (FIG. 3). The thickness of the aluminum layer 7 being deposited can vary within the range of 1–10 $\mu m$ depending on a particular circuit type.

Figure 6:
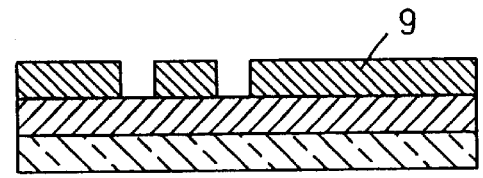
Figure 8:
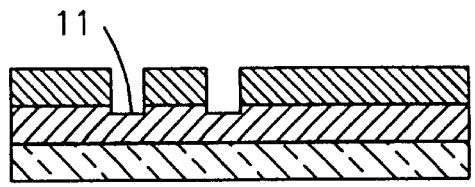
Figure 7:
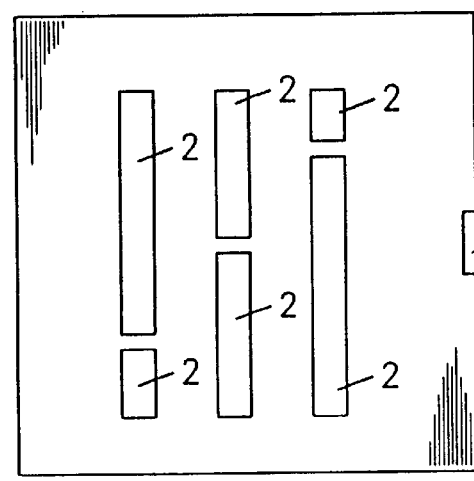
Figure 11:
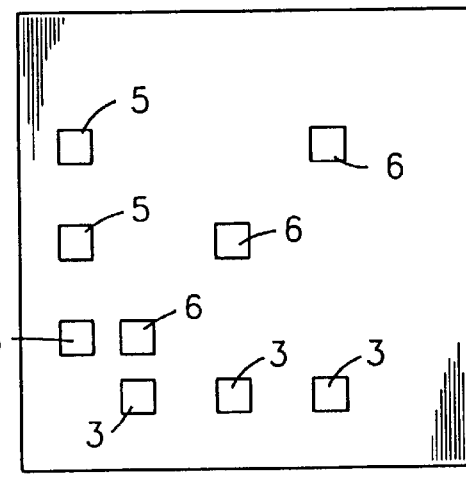

By using a positive photoresist, the first photoresist mask 9 is formed with the exposed regions 2 of the pattern defining the first-level interconnect lines (FIGS. 6,7). The surface of the exposed parts of the aluminum layer 7 is barrier anodized in 0.5–1.0% aqueous solution of citric acid, and the barrier aluminum oxide 11 is formed at a forming voltage of 150–180 V (DC) (FIG. 8).

Figure 9:
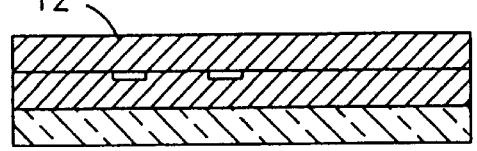

The blocking mask 9 is removed, and an upper aluminum layer 12 is deposited (FIG. 9). The thickness of the aluminum layer 12 being deposited can be within the range of 1–10 $\mu m$ depending on a particular circuit type.

Figure 10:
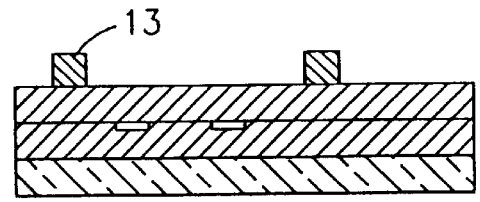
Figure 12:
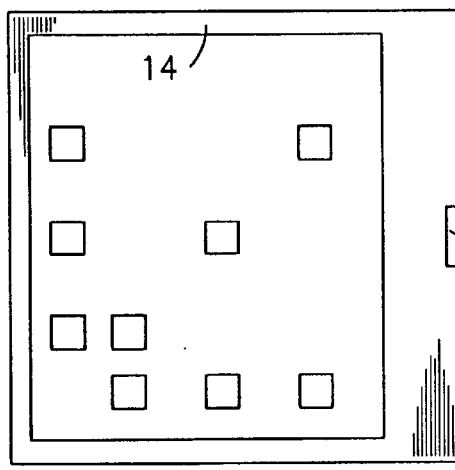

The second photoresist mask 13 in a pattern of the contact pads 3, 5 and contact vias 6 to the second level (FIG. 10) and a photoresist mask 14 over the perimeter of the substrate 1 with the voltage supply area 10 (FIG. 12) are formed on the surface of the upper aluminum layer 12.

Figure 13:
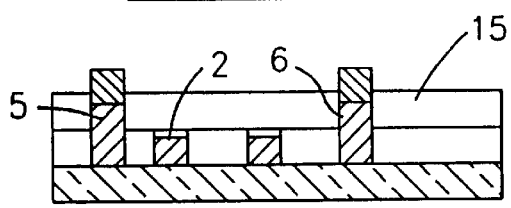

Further, the process of through porous anodization of the main 7 and upper 12 aluminum layer is carried out in 4% aqueous solution of orthophosphoric acid at forming voltage 80–90V. At that, the porous oxide 15 is formed above and between the interconnect lines 2 of the first-level interconnections. The porous oxide 15 between the lines 2 provides the intercomponent insulation, and the porous oxide 15 combined with the barrier oxide 11 above the lines 2 provides the interlevel insulation (FIG. 13).

Thus, the first level of a multilevel system of electronic elements is formed.

The second and the following layers of a multilevel system are formed in the same order (FIG. 3–13), the photoresist mask 14 over the substrate 1 perimeter is enlarged by the value of the doubled photolithographic error.

Figure 29:
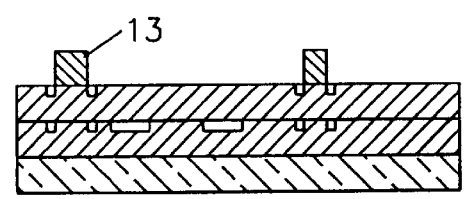

FIG. 29 shows the position (crosshatched) of the contour of the photoresist mask 14 over the first-level substrate 1 perimeter.

EXAMPLE 2

An aluminum layer 7 of 1–3 $\mu$m thickness is deposited onto a glassceramic substrate 1 preheated to a temperature 120°–150° C., at a residual pressure of $1.33 \times 10^{-3}$Pa by the electron-beam evaporation method.

Figure 4:
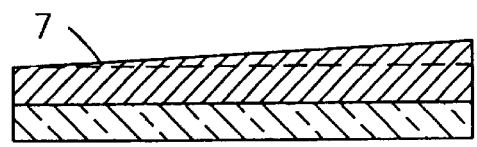

The aluminum layer 7 is deposited such that its thickness uniformly increases from one of the edges to the opposite edge, and its thickness gain, measured in nm per unit substrate 1 length in mm, is within the range of 1.5–2.0 (FIG. 4).

By using a positive photoresist, the first photoresist mask is formed with the exposed parts of the pattern of the first-level interconnect lines 2 (FIGS. 6 and 7). The surface of the exposed regions of the aluminum layer 7 is barrier anodized in an 0.5–1.0% aqueous solution of citric acid, and a barrier aluminum oxide 11 is formed at a forming voltage 150–180 V (FIG. 8).

All subsequent steps are carried out in the same order and under the same conditions as in Example 1, but in the process of porous anodization the voltage is supplied from the substrate 1 side having the larger thickness of the deposited aluminum layer 7.

EXAMPLE 3

All production steps of the multilevel system of electronic parts are carried out in the same order and under the same conditions as in Example 1, but the process of porous anodization is realized by immersing the substrate 1 into the electrolyte at a rate $0.4–1.0 \times 10^{-4}$m/s perpendicularly to the electrolyte surface. The immersed substrate 1 is kept in the electrolyte for 40–90 minutes until the aluminum layer 7, 12 are totally oxidized.

EXAMPLE 4

All production steps of the multilevel system of electronic parts prior to the step of making the second photolithographic mask 13 are carried out in the same order and under the same conditions as in Example 1.

Figure 16:
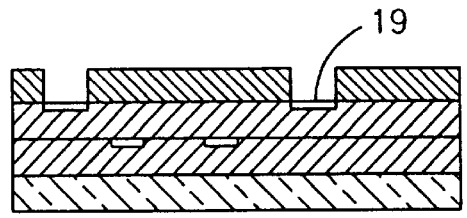
Figure 14:
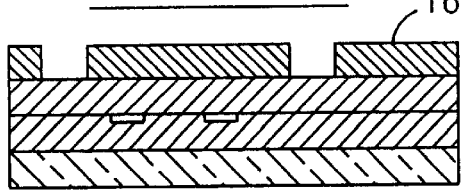
Figure 15:
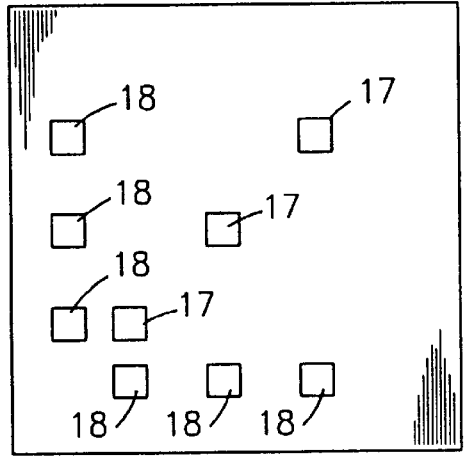

Then, an additional photoresist mask is formed on the surface of the upper aluminum layer 12 (FIG. 14), and the process of barrier anodization is carried out in an 0.5–1.0% aqueous solution of citric acid at a forming voltage 150–180 V (FIG. 16). At that, the barrier aluminum oxide 19 is formed above the contact pads 18 and contact vias 17 to the next level (FIGS. 15 and 16).

Figure 17:
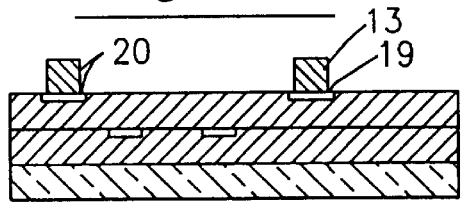

After this, the additional photoresist mask 16 is removed, at the second photoresist mask 13 is formed in a pattern of the contact vias and contact pads. The barrier aluminum oxide 19 and the photoresist mask 13 form a blocking mask 20 (FIG. 17), the geometrical sizes of the contact pads 3 and contact vias 6 on the photoresist mask 13 being smaller than the sizes of the barrier oxide 19 by the value of the doubled photolithographic error (FIGS. 15 and 17).

Figure 18:
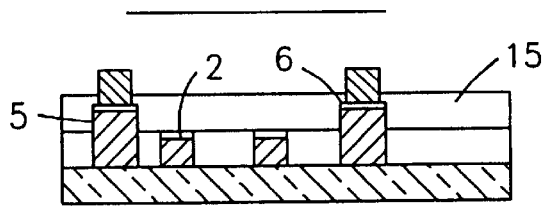

Then, the main aluminum layer 7 and the upper aluminum layer 12 are through anodized in 4% aqueous solution of orthophosphoric acid at forming voltage 80–90V (FIG. 18) the porous oxide 15 being formed above the first-level interconnect lines 2 and between them. Simultaneously, the contact pads 5 and the contacts vias 6 to the next level are formed.

Figure 19:
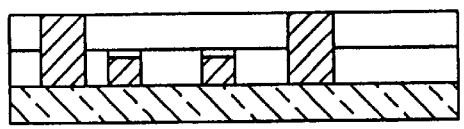

The photoresist mask 13 and the barrier aluminum oxide 19 are removed by mechanical surface polishing and using water-soluble abrasive pastes, at a disk-rotation rate of 100 revs/min and a disk pressure of 0.7 mPa (FIG. 19), the elevated steps of the porous aluminum oxide 15 being removed producing an entirely planar surface (FIG. 19).

After the polishing step, a rinse step is carried out for 3–5 minutes in flowing distilled water, and in organic solvents, e.g., in dimethylformamide.

The second and the subsequent levels of the multilevel system are formed in the same way, the photoresist mask 14 over the substrate 1 perimeter in each level being enlarged by the value of the doubled photolithographic error.

EXAMPLE 5

Figure 5:
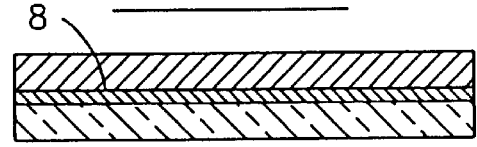

A valve-metal (e.g., tantalum) layer 8 of 30–50 nm thickness is deposited onto a glassceramic substrate 1 preheated to 250°–300° C., at a residual pressure of $1.33 \times 10^{-4}$ Pa by the electron-beam evaporation method (FIG. 5).

Then, the aluminum layer 7 of 1–3 $\mu$m thickness is deposited onto the valve-metal layer 8 on the substrate 1 cooled down to the 150° C. in one vacuum cycle.

By using a positive photoresist, the first photoresist mask 9 is formed with exposed parts corresponding to the first-level interconnect lines pattern 2 (FIGS. 6 and 7). The surface of the exposed parts of the aluminum layer 7 is barrier anodized in 0.5–0.1% aqueous solution, and the barrier aluminum oxide 11 is formed at forming voltage 150–180V (FIG. 8).

Figure 20:
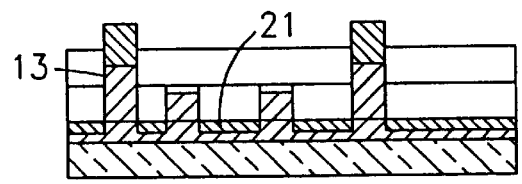

The photoresist mask is removed, and an upper aluminum layer 12 of 1–3 $\mu$m is deposited (FIG. 9). A second photoresist mask 13 is formed on the surface of the upper aluminum layer 12, and the two aluminum layers 7 and 12 are through oxidized in 4% aqueous solution of orthophosphoric acid at forming voltage 80–90V, the porous aluminum oxide 15 being formed and barrier tantalum oxide 21 being formed from a part of the valve-metal layer 8 (FIG. 20).

Figure 21:
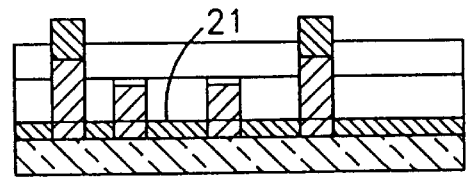

After this, a process of through barrier anodization of the remaining tantalum layer 8 is carried out with the same photoresist mask 13 in 0.5–1.0% aqueous solution of citric acid at a forming voltage of 120–150V (FIG. 21), the barrier tantalum oxide 21 being formed form the whole valve-metal layer 8.

Then, the photoresist mask 13 is removed, and the substrates with the formed structure are placed into a muffle heated to a temperature in the range of 350°–450° C. and annealed during 30–60 minutes.

Thus, the first-level of the multilevel system is formed.

The second and the subsequent levels of the multilevel system are formed in the same way, the photoresist mask 14 over the substrate 1 perimeter being enlarged in every subsequent level by the value of the doubled photolithographic error.

EXAMPLE 6

An aluminum layer 7 of 1–5 mm thickness is deposited onto a glassceramic substrate 1 preheated to a temperature of 120°–150° C. at a residual pressure of $1.33 \times 10^{-3}$ by the electron-beam evaporation method.

Figure 22:
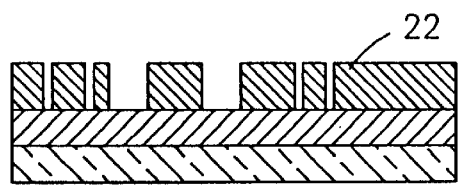
Figure 27:
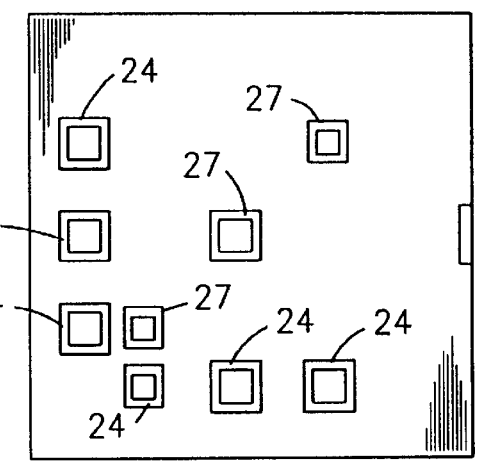
Figure 23:
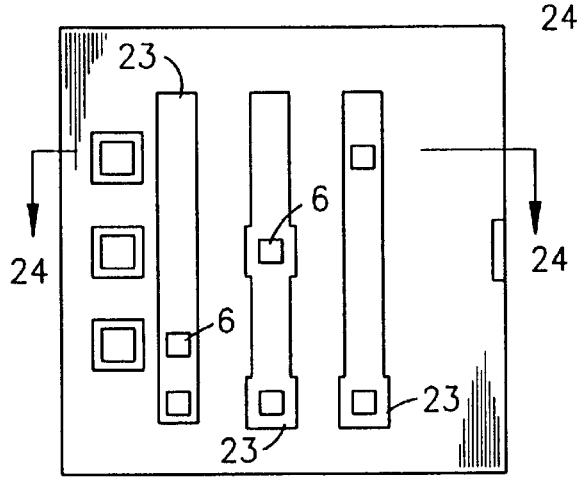
Figure 24:
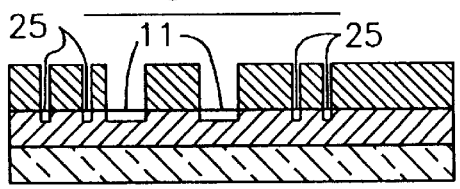
Figure 25:
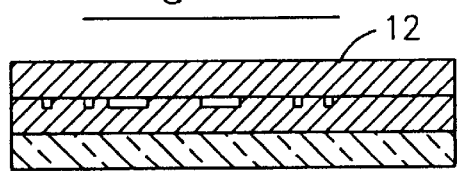

By using a positive photoresist, the first photoresist mask 22 is formed in a pattern of the first level lines with the frames around the contact pads and contact vias (FIG. 22 and 25). The surface of the exposed regions of the aluminum layer 7 is barrier anodized in an 0.5–1.0% aqueous solution of citric acid and a barrier aluminum oxide 25 is fored at a forming voltage of 150–180 V (FIG. 24).

The first photoresist mask 22 is removed, and an upper aluminum layer 12 of 1–5 mm thickness is deposited (FIG. 25).

Figure 28:
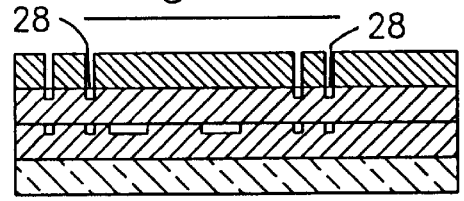
Figure 26:
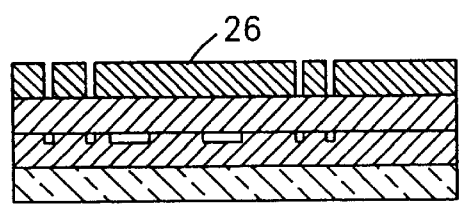
Figure 30:
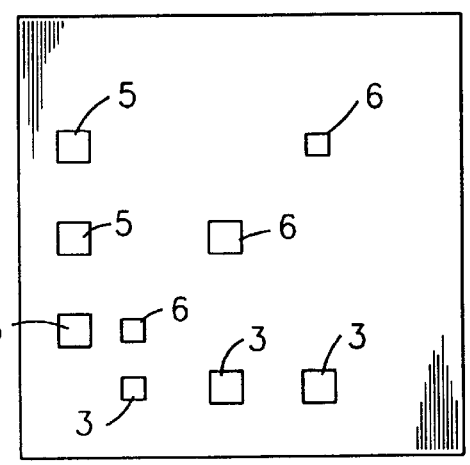
Figure 32:
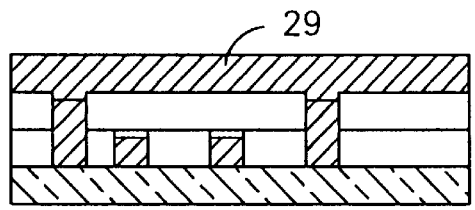
FIG. 32 shows the upper aluminum layer 22 of the second level.

The additional photoresist mask 26 in a pattern of the frames around the contact pads 3, 5 and contact vias 6 to the second level (FIG. 26, 27) are formed on the surface of the upper aluminum layer 12. The surface of the exposed parts of the aluminum layer 12 is barrier anodized in 0.5–1.0% aqueous solution of citric acid, and the barrier aluminum oxide 28 is formed at a forming voltage of 150–180 V (FIG. 28).

The additional photoresist mask 26 is removed, and the second photoresist mask in a pattern of the contact pads 3, 5 and contact vias 6 to the second level (FIG. 29, 30) is formed on the surface of the upper aluminum layer 12.

Figure 31:
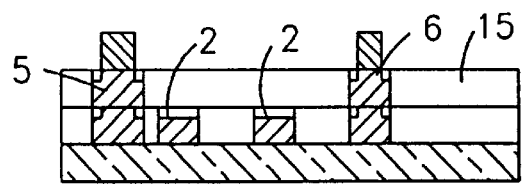
FIG. 31 shows the porous aluminum oxide 15 between the first level interconnect lines 2, and between the contact pads 5 and contact vias 6 in case to form the frames around these elements.
Figure 33:
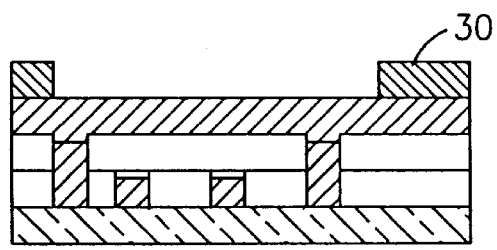
FIG. 33 shows the third photoresist mask 23 formed in a pattern leaving exposed the second-level lines.
Figure 36:
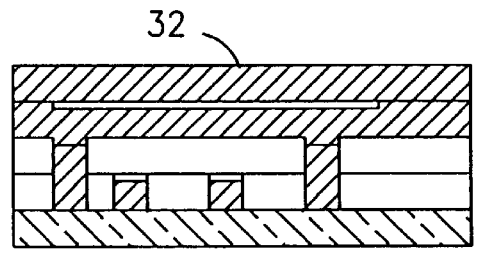
FIG. 36 shows the upper aluminum layer 25 of the second level.
Figure 34:
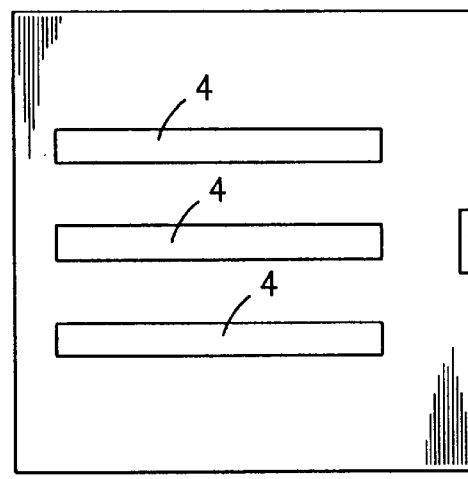
FIG. 34 shows a top of the third photoresist mask leaving exposed the second-level lines 4.
Figure 37:
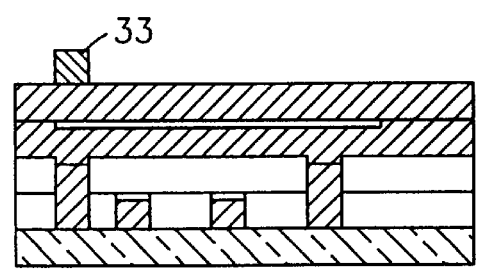
FIG. 37 shows the fourth photoresist mask 26 formed in a pattern of the contact pads.
Figure 35:
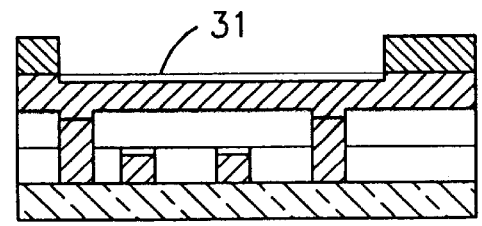
FIG. 35 shows the barrier aluminum oxide 24 above the second-level lines.
Figure 38:
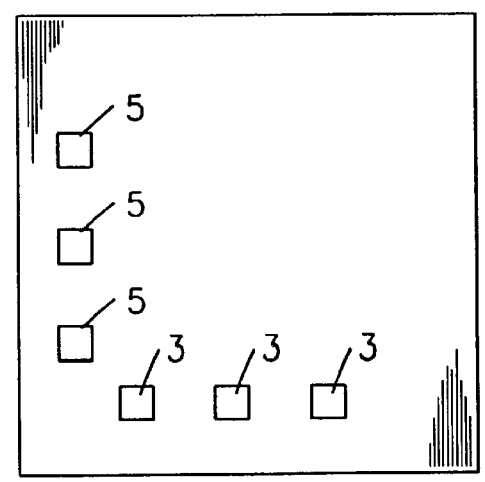
FIG. 38 shows a top view of the fourth photoresist mask in a pattern of contact pads 3, 5.
Figure 39:
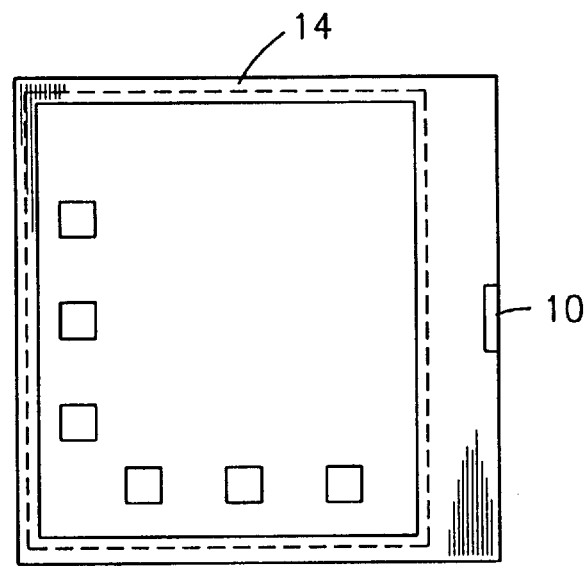
FIG. 39 shows a top view of the fourth photoresist mask with the fringe 14 over the substrate perimeter, the region 10 of the voltage supply excluded.
Figure 40:
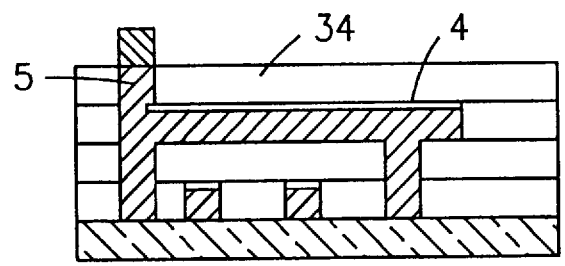
FIG. 40 shows the porous aluminum oxide 27 above the lines of the second level 4 and between the contact vias 5.

Further, the process of through porous anodization of the main 7 and upper 12 aluminum layers is carried out in 4% aqueous solution of orthophosphoric acid at a forming voltage of 80–90 V (FIG. 31).

Thus, the first level of a multilevel system of electronic elements is formed.

All subsequent steps are carried out in the same order and under the same conditions as in Example 1, but the geometrical sizes of the barrier oxide over the frames around the contact pads and contact vias areas exceed those of the corresponding photoresist mask. The edges of the photoresist mask is designed to be in the middle of the corresponding frames around the contact pads and contact vias barrier oxide.

The method proposed allows to obtain a planar multilevel system of electronic-elements interconnections with high insulting properties of he intercomponent and interlevel insulation, having a planar relief of each level surface, high reliability and reproducibility of the parameters, accurate geometrical sizes of the interconnect elements.

With all this, the potentialities of the geometric designs broaden, the incorporation of passive resistive and capacitive elements into any level of the interconnect system is provided, as well as the compatibility with metal wiring boards, which increases the quality, reliability and scale of integration of microelectronic devices and ensures their high resistance to mechanical, temperature and electromagnetic effects.

What is claimed is:

1. A process for forming a multilevel electronic interconnect structure, said electronic interconnect structure having level conductive paths parallel to a substrate and interlevel electrical interconnections perpendicular to said substrate, said process comprising the steps of:
   (a) forming of the first level of the interlevel electronic interconnect structure by a process comprising the steps of:
      (1) depositing a valve metal layer onto a surface of said substrate;
      (2) depositing a main aluminum layer onto a surface of said valve metal layer;
      (3) forming on a surface of the main aluminum layer a blocking mask leaving exposed a pattern of the level interconnect lines to be formed;
      (4) carrying out a barrier anodization process to form a surface barrier oxide over the level interconnect lines;
      (5) removing the blocking mask;
      (6) depositing an upper aluminum layer over the main aluminum layer;
      (7) forming on the upper aluminum layer a blocking mask in a pattern of the contact pads and contact vias; and
      (8) subjecting said main and upper aluminum layers and said valve metal layer to anodization to selectively through porous anodize the aluminum layers and partially barrier anodize the valve metal, and removing the blocking mask;
   (b) forming at least one additional layer by depositing another of said main aluminum layer on the exposed surface of said upper aluminum layer and then repeating steps (3)–(8); and
   (c) through anodizing the valve metal layer either before or after step (b).

2. A process according to claim 1, comprising a step of thermal treatment at a temperature in the range of 350°–450° C.

3. A process according to claim 1, wherein said valve metal is a metal selected from the group consisting of tantalum, titanium, niobium, hafnium and zirconium.

4. A process for forming a multilevel electronic interconnect structure, said electronic interconnect structure having level conductive paths parallel to a substrate and interlevel electrical interconnections perpendicular to said substrate, said process comprising the steps of:
   providing a main aluminum layer onto a surface of said substrate;
   defining level conductive paths by forming a blocking mask on a surface of said main aluminum layer, said blocking mask leaving exposed areas corresponding to said level conductive paths;
   carrying out a barrier anodization process to form a surface barrier oxide over said level conductive paths;
   removing the blocking mask;
   providing an upper aluminum layer over the main aluminum layer;
   defining interlevel interconnections by providing on said upper aluminum layer a blocking mask with exposed areas defining said interlevel interconnections;
   carrying out a barrier anodization process to form a surface barrier oxide defining said interlevel interconnections;
   forming a blocking mask over the barrier oxide defining said interlevel interconnections;
   subjecting both aluminum layers to porous anodization; and
   removing the photoresist mask and the barrier oxide.

5. A process according to claim 4, wherein the geometrical sizes of the surface barrier oxide defining the interlevel interconnections exceed those of the blocking mask formed over the surface barrier oxide defining the interlevel interconnections.

6. A process according to claim 4, wherein the blocking mask is a photoresist mask, and wherein said photoresist mask is smaller than the interlevel interconnect barrier oxide areas by a value exceeding twice the photolithographic error.

7. A process according to claim 4, wherein said step of removal of the blocking mask and the barrier oxide comprises surface polishing.

8. A process for forming a multilevel electronic interconnect structure, said electronic interconnect structure having level conductive paths parallel to a substrate and interlevel electrical interconnections perpendicular to said substrate, said process comprising the steps of:

provinding a main aluminum layer onto a surface of a substrate;

defining level conductive paths by forming a blocking mask on said main aluminum layer, said blocking mask leaving exposed areas corresponding to said level conductive paths, said blocking mask also leaving exposed a frame around the level conductive paths;

carrying out a barrier anodization process on said main aluminum layer to form a surface barrier oxide over said level conductive paths and a surface barrier oxide defining a frame around said level conductive paths;

removing said blocking mask;

providing an upper aluminum layer over the main aluminum layer;

defining interlevel interconnections within the area defined by the frame by providing on said upper aluminum layer a blocking mask with exposed areas defining said interlevel interconnections, said blocking mask leaving exposed a frame around the level conductive paths and interlevel connections and corresponding to the frame formed on the main aluminum layer;

carrying out a barrier anodization process on said upper aluminum layer to form a surface barrier oxide defining said interlevel interconnections and said frame on said upper aluminum layer;

forming a photoresist mask in a pattern defining interlevel interconnections;

subjecting said main and upper aluminum layers to porous anodization; and removing the photoresist mask and surface barrier oxide over said upper aluminum layer.

9. A process according to claim 8, wherein the geometrical size of the barrier oxide on the upper aluminum layer defining the frame around the interlevel interconnect and level contact paths exceed those of the corresponding photoresist mask.

10. A process according to claim 8, wherein the edges of the photoresist mask are designed to be in the middle of the corresponding barrier oxide frames around the interlevel interconnections and level conductive paths.

11. A process according to claim 8, wherein the geometrical sizes of the barrier oxide over the frames around the contact pad and contact via are equal to a value exceeding twice the photolithographic error.

12. A method of making a multilevel system of elecronic parts which comprises the formation of each level of the system by way of depositing an aluminium layer onto the substrate surface, forming on this layer a blocking mask in a pattern of the level lines, carrying out the process of hard anodization, removing the blocking mask and carrying out the process of porous anodization, this method differing in that the additional aluminium layer is deposited after the blocking mask has been removed, and the photoresist mask in a pattern of the contact pads and contact vias to the next level is formed on the above-mentioned layer, and both aluminium layers are subjected to porous anodization.

13. The method according to claim 12, differing in that the hard oxide in a pattern of the contact pads and contact vias to the next level is formed on the surface of the additional aluminium layer prior to the formation of the photoresist mask on the above-mentioned layer, with the subsequent removal of the photoresist mask and the hard oxide after the process of porous anodization, the geometrical sizes in the photoresist mask perimeter being smaller than the sizes of the hard oxide by the value of the doubled photolithographic error.

14. The method according to claim 12, differing in that the layer of a valve metal selected from the group of valve metals is deposited onto the substrate surface prior to the deposition of the main aluminium layer, the process of porous anodization being followed by the process of hard anodization with subsequent thermal treatment at temperature 350°–450 degrees C.

15. The method according to claim 12, differing in that the deposition of the main layer is carried out such that its thickness uniformly increases from one of the edges to the opposite edge, and the thickness gain of the aluminium layer being fdeposited measured in nm perunit substrate length in mm ranges from 1.5 to 2.0, the voltage in the process of porous anodization being supplied from the substrate side having larger thickness of the deposited aluminium layer.

16. The method according to claim 12, differing ni that the photoresist mask over the substrate perimeter is formed, the area of the voltage supply excluded, simultaneously with the formation of the photoresist mask in a patern of the contact pads and contact vias to the next level, and the mask over the substrate perimeter is enlarged by the value of the doubled photolithographic error.

17. A process for making an electronic component having multi level interconnections which comprises the formation of each level of the component by way of depositing a main aluminium layer onto the surface of a substrate;

forming on this layer a blocking mask leaving exposed a pattern of the level interconnect lines and the frames around the contact pads and contact vias to the next level to be formed, carrying out a process of barrier anodization to form barrier oxide over the level interconnect lines and frames, removing the blocking mask;

depositing an upper aluminium layer over the main aluminium layer;

forming a barrier oxide on the surface of the upper aluminium layer in a pattern of the frames around the contact pads and contact vias to the next level;

forming a photoresist mask in the pattern of the contact pads and vias to the next level;

subjecting both aluminium layers to porous anodization; and removing the photoresist mask.

18. A process according to claim 17, wherein the geometrical sizes of the barrier oxide over the frames around the contact pads and contact vias areas exceed those of the corresponding photoresist mask.

19. A process according to claim 17, wherein the edges of the photoresist mask is designed to be in the middle of the corresponding frames around the contact pads and contact vias barrier oxide.

20. A process according to claim 17, wherein the geometrical sizes of the barrier oxide over the frames around the contact pad and contact via are equal to a value exceeding the doubled photolithographic error.

* * * * *